United States Patent [19]

Okamoto et al.

[11] Patent Number: 4,646,301
[45] Date of Patent: Feb. 24, 1987

[54] DECODING METHOD AND SYSTEM FOR DOUBLY-ENCODED REED-SOLOMON CODES

[75] Inventors: Hiroo Okamoto; Masaharu Kobayashi, both of Yokohama; Hiroyuki Kimura, Kanagawa; Takaharu Noguchi; Takao Arai, both of Yokohama, all of Japan

[73] Assignee: Hitachi, Ltd., Tokyo, Japan

[21] Appl. No.: 665,378

[22] Filed: Oct. 26, 1984

[30] Foreign Application Priority Data

Oct. 31, 1983 [JP] Japan ................................ 58-202602

[51] Int. Cl.⁴ .............................................. G06F 11/10
[52] U.S. Cl. ...................................... 371/37; 371/38; 371/39; 371/40
[58] Field of Search ...................... 371/37, 38, 39, 40

[56] References Cited

U.S. PATENT DOCUMENTS

| | | | |
|---|---|---|---|
| 4,397,022 | 8/1983 | Weng | 371/37 |
| 4,437,185 | 3/1984 | Sako | 371/37 |
| 4,476,562 | 10/1984 | Sako | 371/39 |
| 4,497,058 | 1/1985 | Sako | 371/37 |
| 4,532,629 | 7/1985 | Furuya | 371/39 |
| 4,541,092 | 9/1985 | Sako | 371/37 |
| 4,546,474 | 10/1985 | Sako | 371/37 |

*Primary Examiner*—Jerry Smith
*Assistant Examiner*—Robert W. Beausoliel, Jr.
*Attorney, Agent, or Firm*—Antonelli, Terry & Wands

[57] ABSTRACT

Error correction of digital signals is suited for codes having error detection and correction words, such as doubly-encoded Reed-Solomon code. In a first decoding, at least error detection is effected and flags indicating decoding conditions are added. In a second decoding, error detection for first code blocks and error correction for S2 words at unknown locations and E flagged word erasures, where d1 is a Hamming distance and S2 and E satisfy a relation of $2S2+E \leq d1-1$, are parallely or sequentially effected, and a combination of S2 and E having a high correction capability and a low probability of miscorrection is selected from a plurality of correction results of error locations and the numbers of flags added at the first decoding, and the word errors are corrected based on the selected combination.

11 Claims, 20 Drawing Figures

| FIG. 9A | FIG. 9B |

FIG. 12

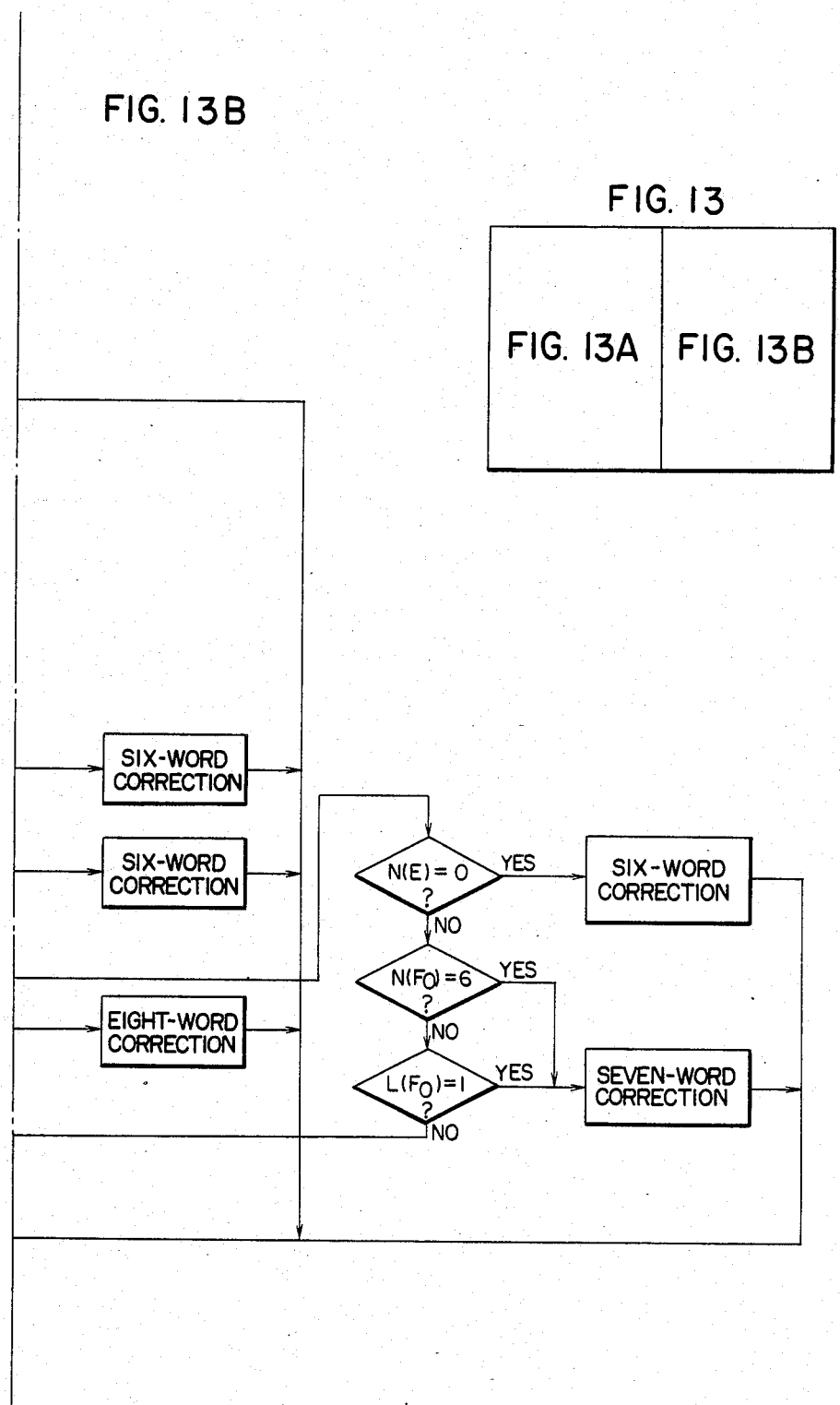
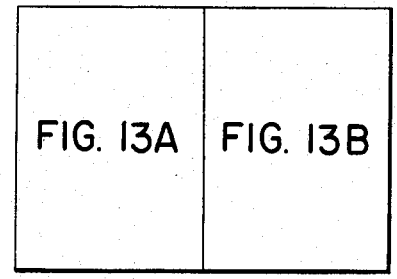

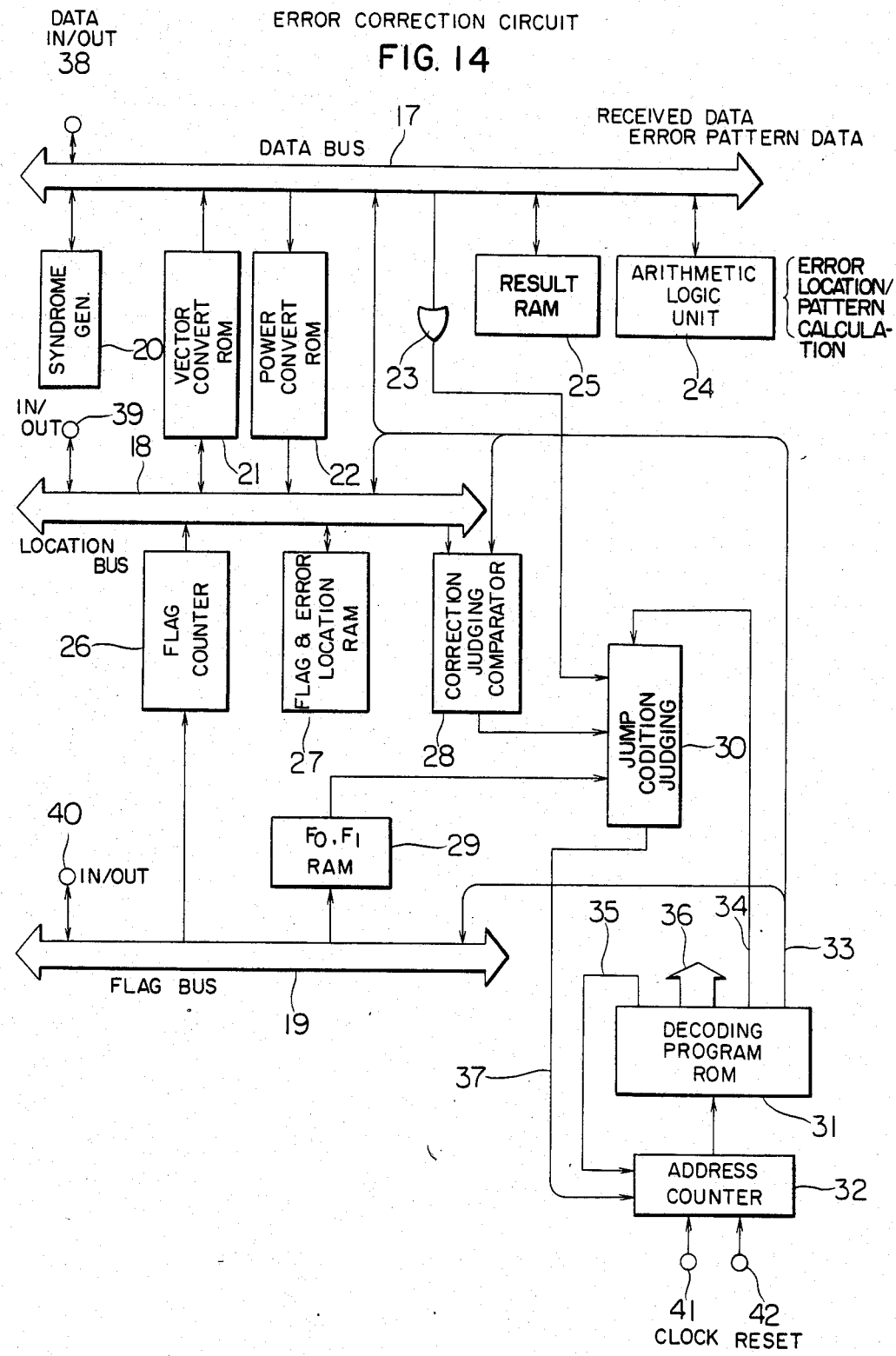
FIG. 14 ERROR CORRECTION CIRCUIT

| FIG. 16A |
| FIG. 16B |

DECODING METHOD AND SYSTEM FOR DOUBLY-ENCODED REED-SOLOMON CODES

CROSS REFERENCES OF THE RELATED APPLICATIONS

This application relates to the U.S. Ser. No. 622,711 filed on June 22, 1984, entitled "Error Correction Method and System" by Hiroo Okamoto, Masaharu Kobayashi, Kenzo Nishimura, Takaharu Noguchi, Takao Arai and Toshifumi Shibuya, based on Japanese patent application No. 110931/83 filed June 22, 1983, No. 1308939/83 filed July 20, 1983 and No. 210858/83 filed Nov. 11, 1983, of which the disclosure is incorporated be reference in this application.

The present invention relates to an error correction in a digital signal reproduction, and more particularly to error correction method and system suitable to decoding of an error correction code such as a doubly-encoded Reed-Solomon code.

In many cases of transmitting digital signals, a check word is added in a transmitting station and an error in a data is detected and corrected in a receiving station using the check word in order to correct the data error generated in a transmission system. The Reed-Solomon code which is efficient and easy for decoding and which is one of BCH codes is, in many cases, used as the check word. The doubly-encoded Reed-Solomon code has a high error correction capability and is used in a PCM recorder and a digital audio disc (DAD).

FIG. 1 is one example of the doubly-encoded Reed-Solomon code. Numeral 1 denotes information words, numeral 2 denotes first check words and numeral 3 denotes second check words. In encoding, the first check words $Q_0$, $Q_1$, $Q_2$ and $Q_3$ are added to the twelve information words $W_0$-$W_{11}$. The block consisting of the twelve information words and the four first check words is called a $C_2$ block 5. Words of the $C_2$ block 5 are interleaved into an arrangement shown in FIG. 1. The second check words $P_0$ and $P_1$ are added to the twelve information words $W_0$-$W_{11}$ and the first check words $Q_0$, $Q_1$, $Q_2$ and $Q_3$ in each $C_2$ block 5. The block consisting of the twelve information words, the four first check words and the two second check words is called a $C_1$ block. In decoding, an error detection and an error correction are made for the $C_1$ block, it is deinterleaved, an error detection and an error correction are made for the $C_2$ block, and a decoded signal is outputted.

In the doubly-encoded system, a correction capability is enhanced by decoding two or more times for the two different code blocks ($C_1$ and $C_2$). Such an error correction system is disclosed in the U.S. Pat. No. 4,437,185 to Sako issued on Mar. 13, 1984 (British Patent GB No. 2079993A). In such a decoding system, however, only one or two words are corrected and the error detection and correction capability inherent to the code is not fully utilized. Since an error detection flag is not fully utilized in the second decoding, the capability of the code is reduced.

It is an object of the present invention to provide error correction method and system which can fully utilize the error detection and correction capability inherent to the doubly-encoded error correction code.

In accordance with one aspect of the present invention, there are provided error correction method and system in which the number of errors is detected in a second decoding of a doubly-encoded error correction code, and erasure and error correction is effected only when a probability of miscorrection is low based on the result of the detection.

In accordance with another aspect of the present invention, there are provided error correction method and apparatus in which an error is corrected in the second decoding of the doubly-encoded error correction code when a probability of error is high and errors are small, errors having small probability of error are sequentially detected, the number of corrections for erasure are increased based on the result of the detection and status of flag representing the result of first decoding so that both error detection capability and error correction capability are enhanced.

In accordance with a further aspect of the present invention, there are provided error correction method and system in which the error correction code such as doubly-encoded Reed-Solomon code is used to reproduce a digital signal of a digital audio system, a flag representing a status of the first decoding is added, the signal is decoded more than one time in the second decoding by using the flag to determine an error word location and an error pattern and a result which meets a desired requirement is selected to correct the error in the word.

The present invention is outlined below. The first decoding is effected to the doubly-encoded error correction code and the flag representing the decoding status is added. In the second decoding, the decoding is effected more than one time of using the flag and an optimum decoding method is determined based on the decode result and the error correction is made by using the decode result by the optimum decoding method. Thus, the error correction capability and the error detection capability are enhanced.

The selection criterion for the second decoding method is determined by a compromise or a requirement for the correction capability and the detection capability determined by the probability of occurrence of the flag added in the first decoding, the probability of failure of error detection, the probability of incapability of correction of codes in the second decoding and the probability of incapability of detection.

Figure 6:
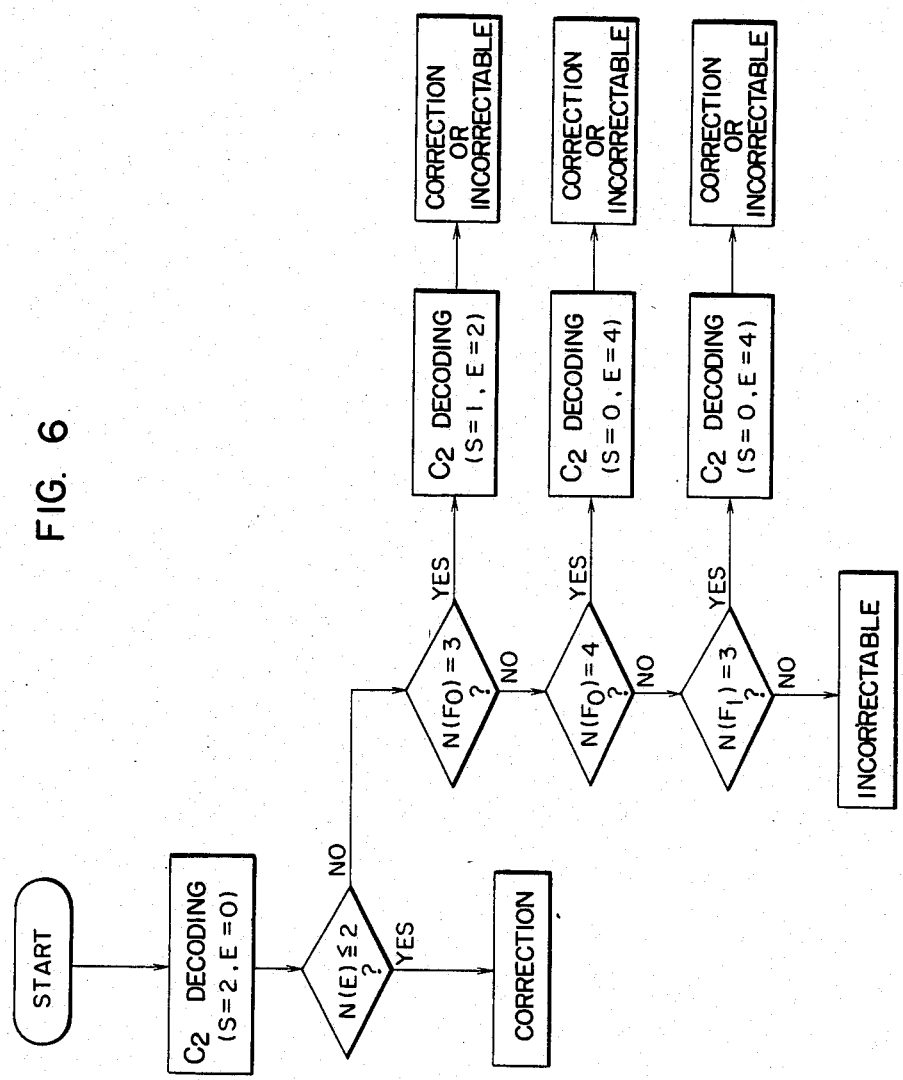
FIG. 6 is a flow chart of the $C_2$ decoding of the present invention.
Figure 7:
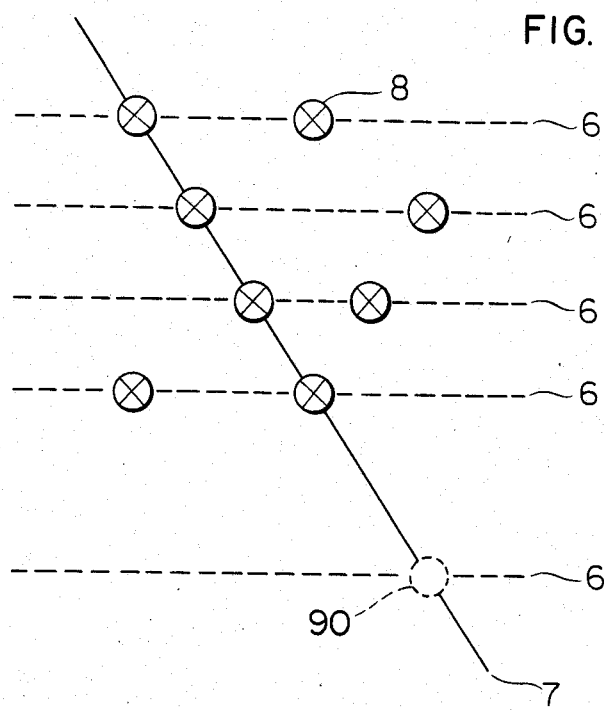
Figure 8:
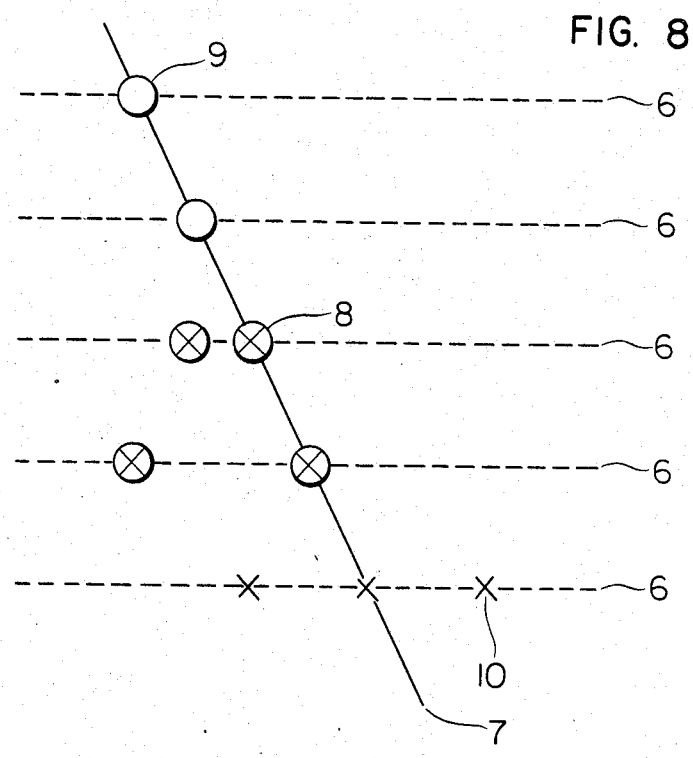
Figures 9, 9B:
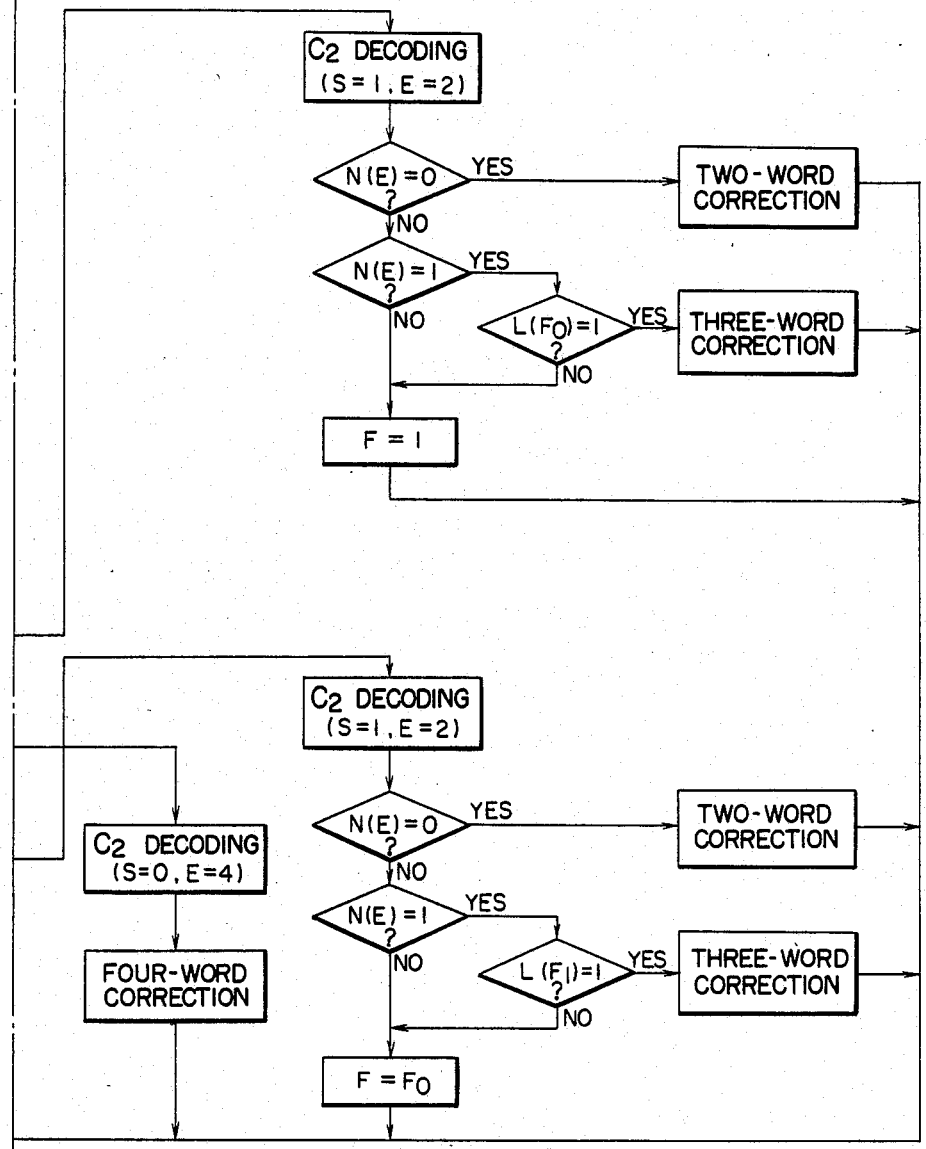
Figure 9A:
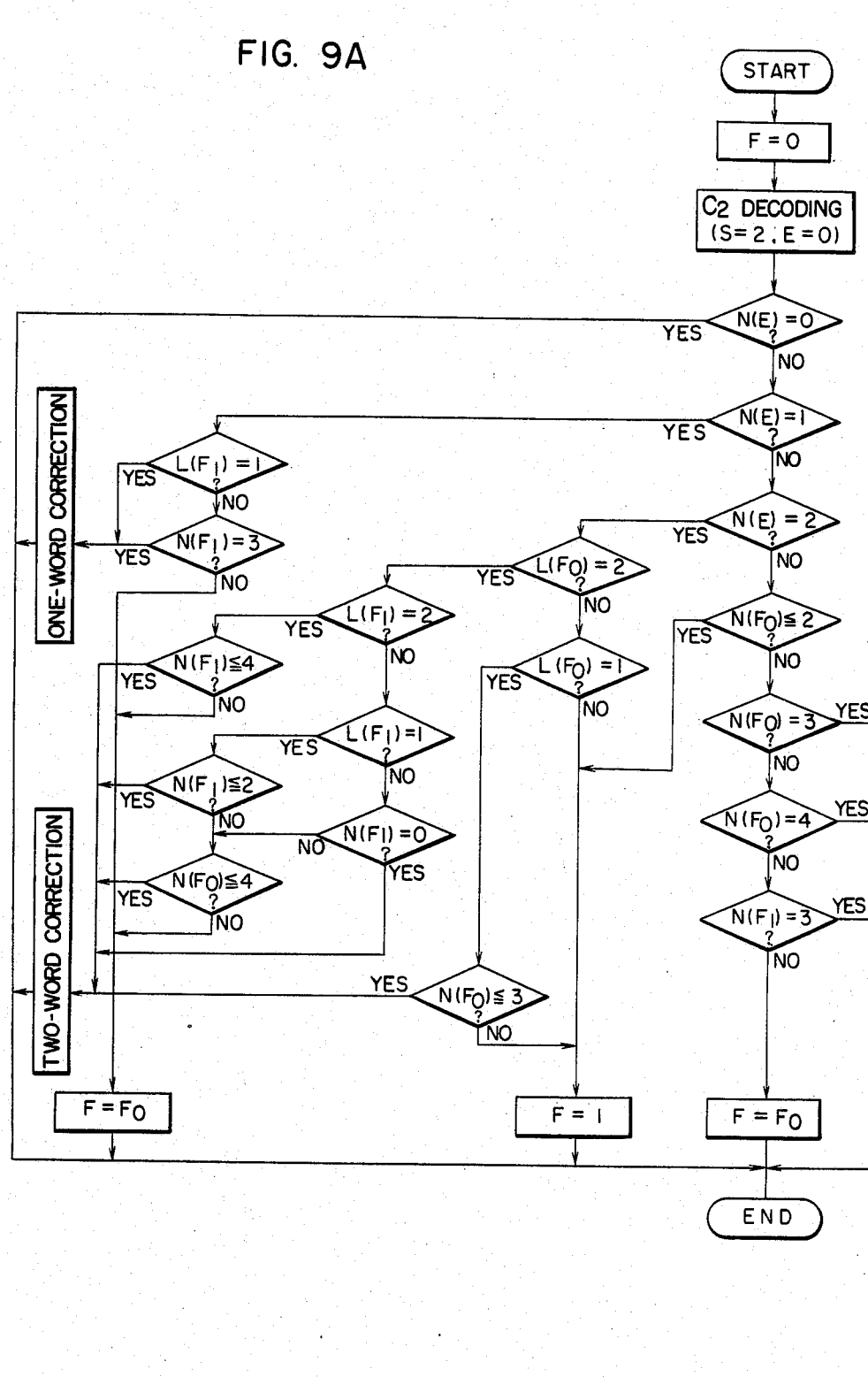
Figure 10:
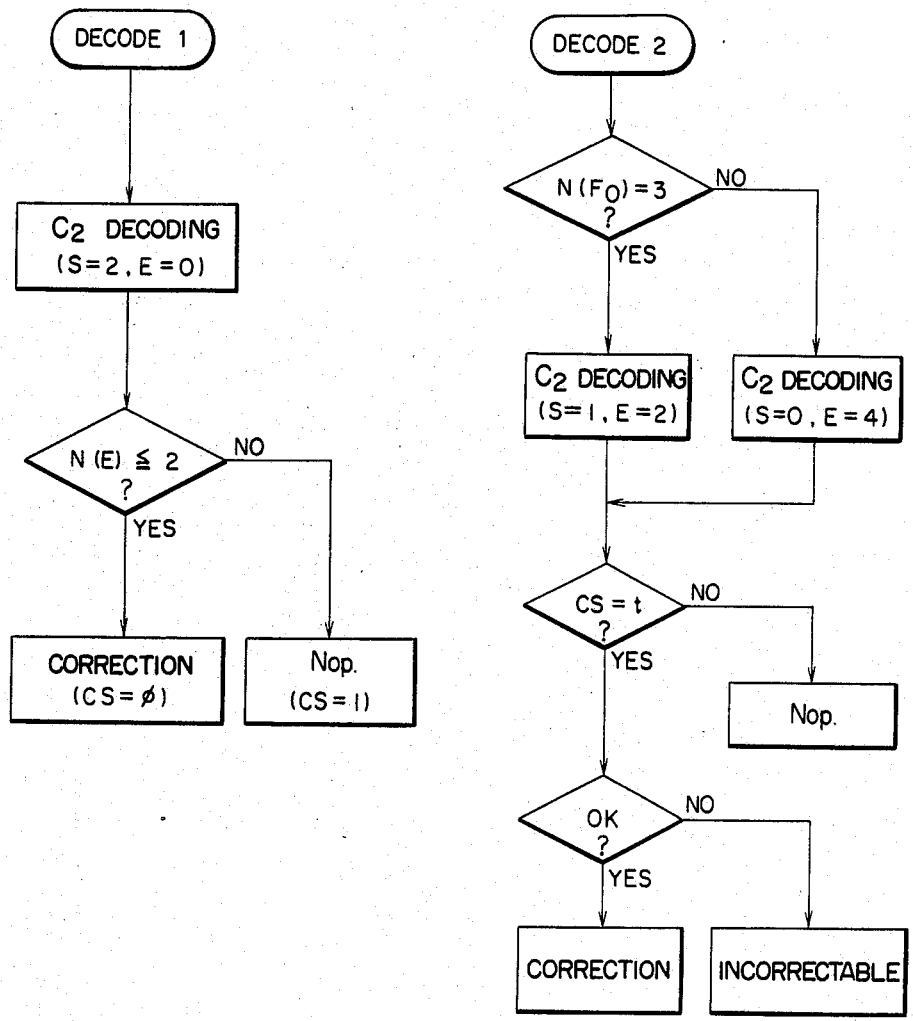
Figure 11:
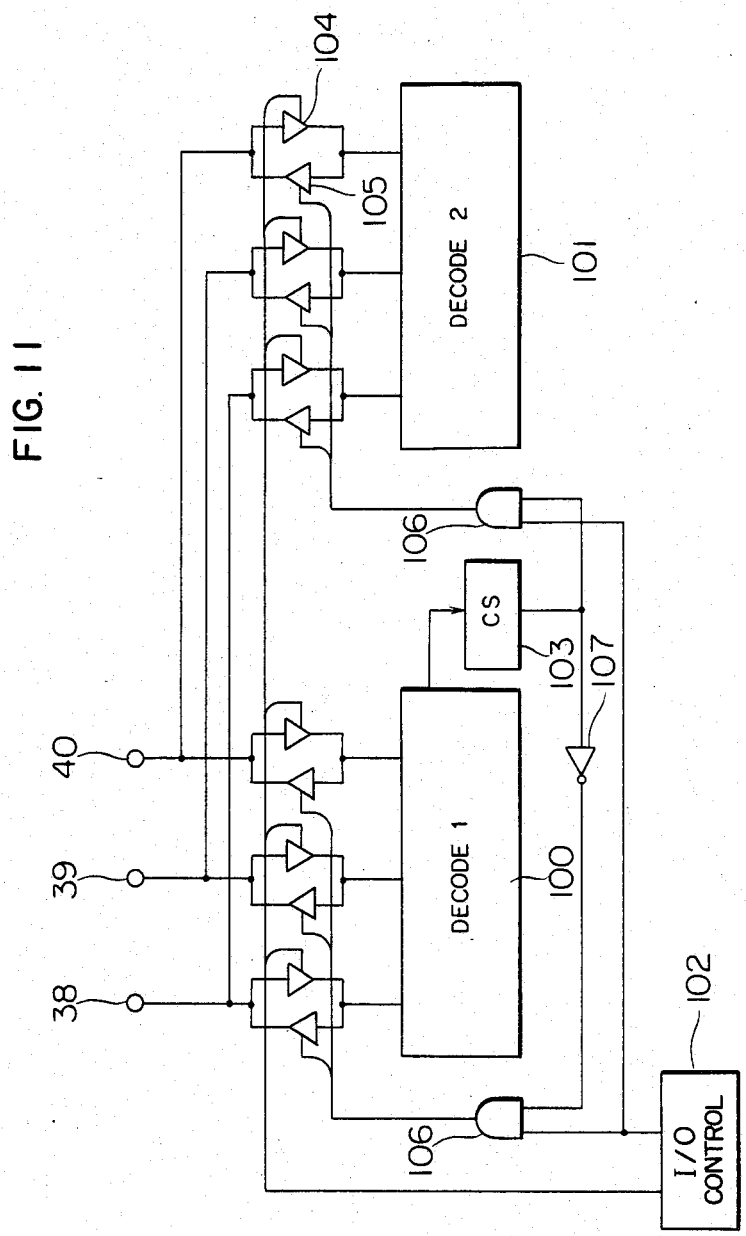
Figure 13A:
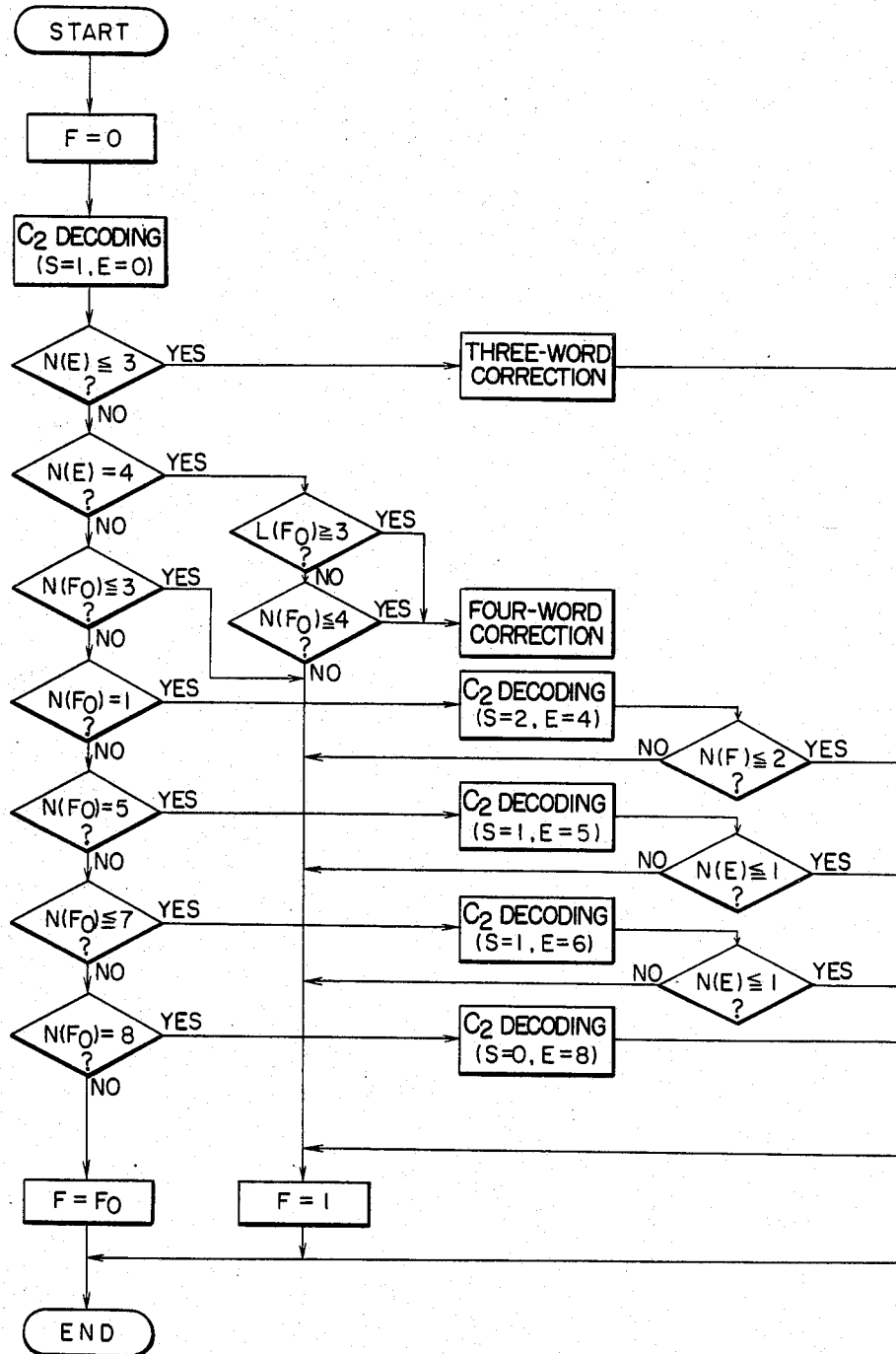
Figure 15:
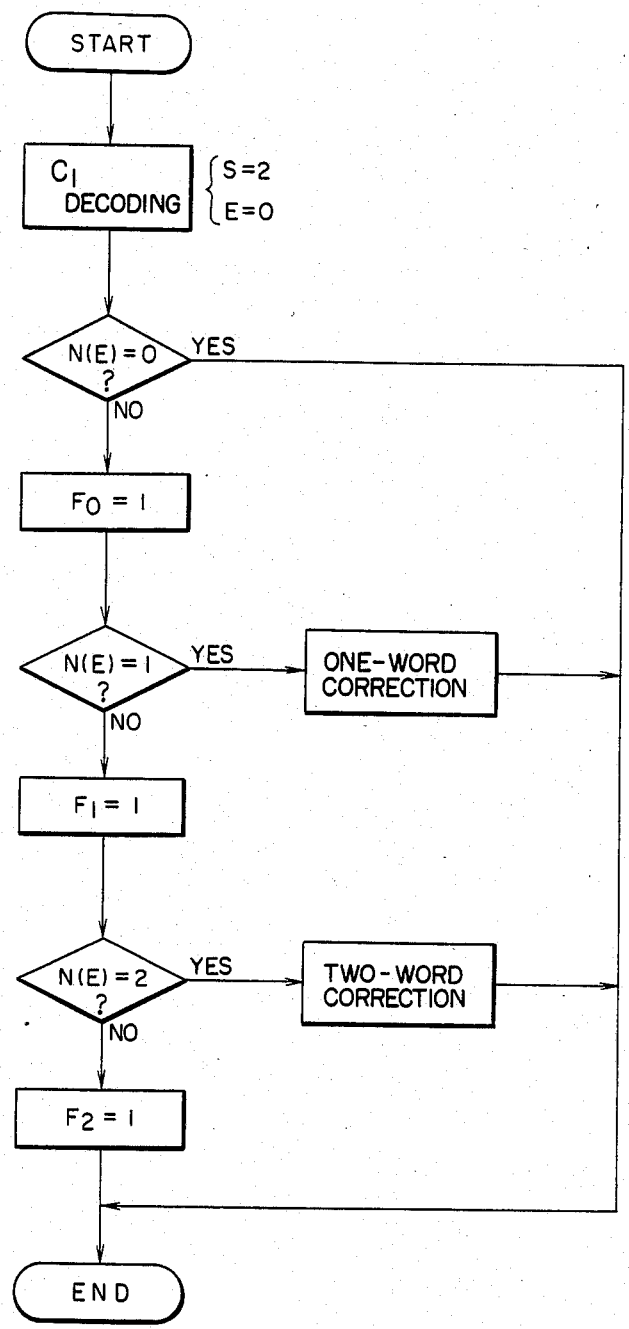
Figures 16, 16B:
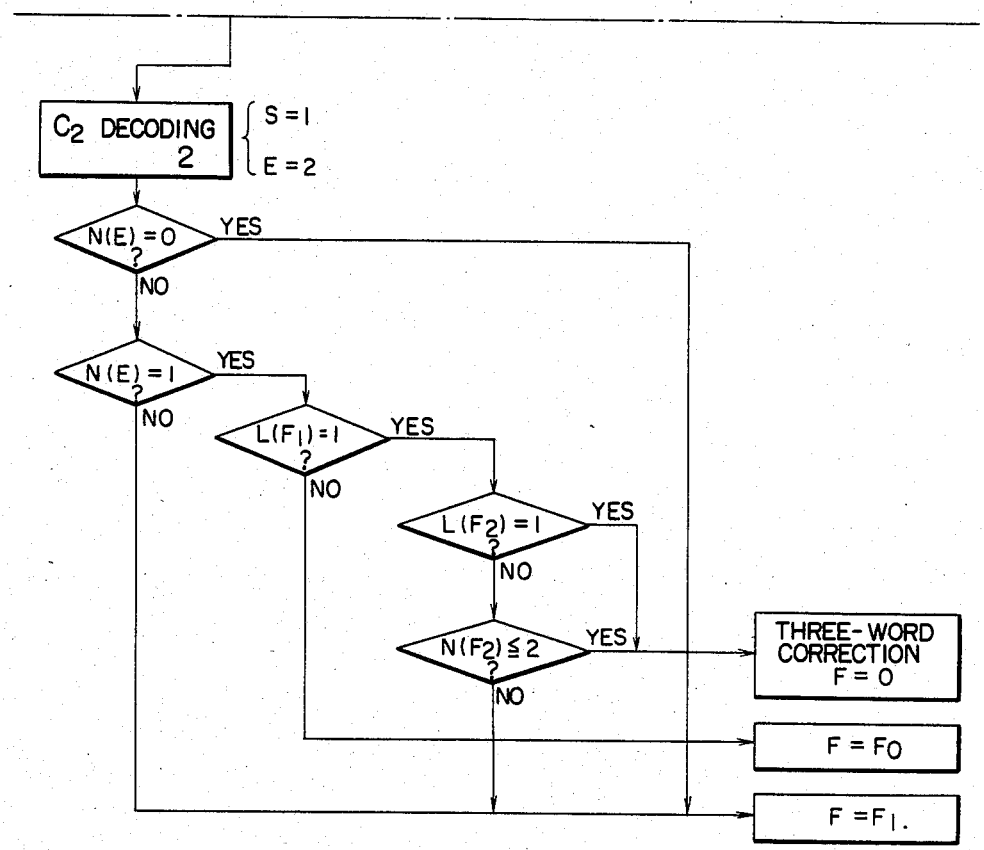
Figure 16A:
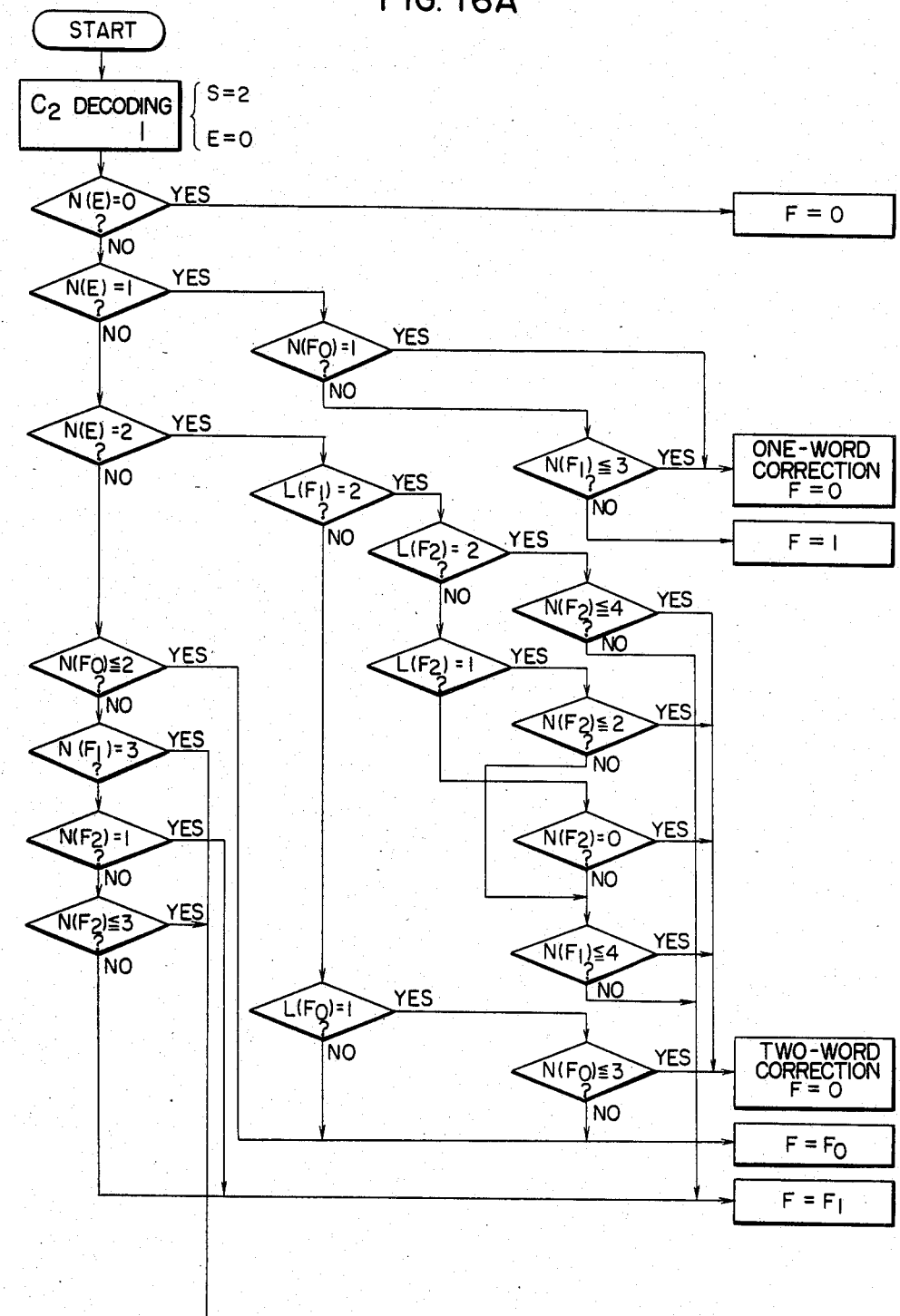
Figure 17:
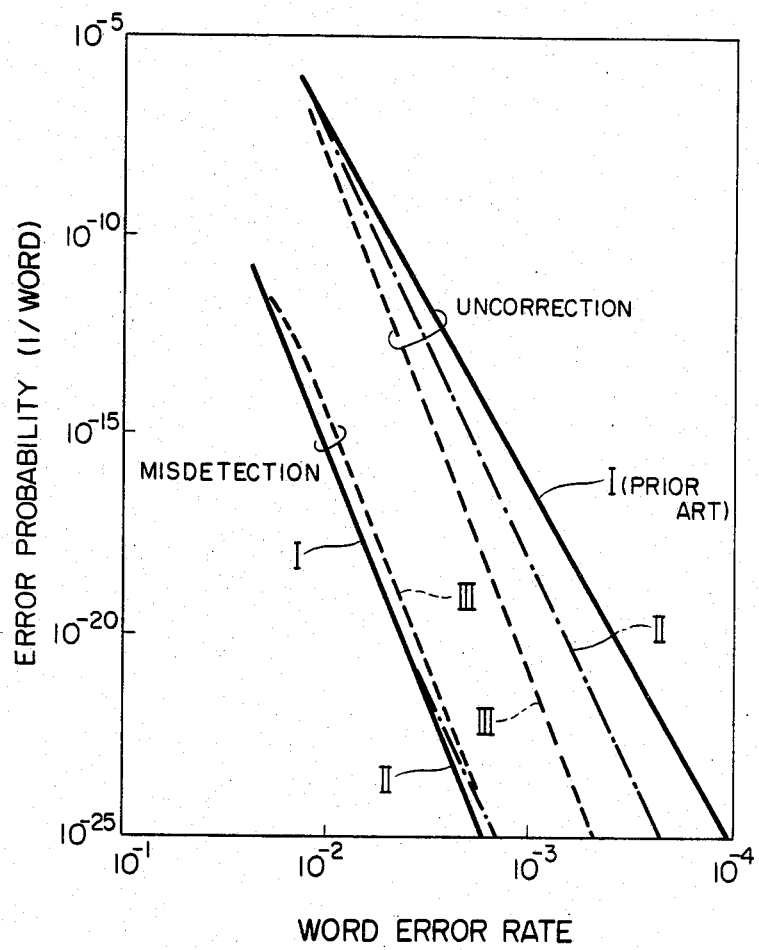

FIGS. 7 and 8 show miscorrectable and incorrectable error patterns for the $C_2$ block, FIG. 9A and 9B shows a detail of FIG. 6, and FIG. 9 shows how FIGS. 9A and 9B are combined, FIG. 10 is a flow chart for another embodiment of the present invention, FIG. 11 is a block diagram of one embodiment of a system for implementing the method of FIG. 10, FIG. 12 shows another example of the doubly-encoded error correction code, FIG. 13A and 13B in combination form a flow chart of the $C_2$ decoding when the present invention is applied to the code of FIG. 12, and FIG. 13 shows how FIGS. 13A and 13B are combined, FIG. 14 is a block diagram of one embodiment of an error correction circuit of the present invention, FIG. 15 is a flow chart for an embodiment of the present invention applied to DAD, FIG. 16A and 16B in combination form a flow chart showing a detail of FIG. 15, and FIG. 16 shows how FIGS. 16A and 16B are combined, and FIG. 17 shows comparative characteristic curves of error detection capabilities and error correction capabilities of the embodiment of FIGS. 15 and 16, a prior art system and a comparative system.

Before the embodiments of the present invention are explained, the invention of the related application U.S. Ser. No. 622,711 is briefly explained for a purpose of easy understanding of the present invention. The related invention was not published before the present invention and is not cited as a prior art. The disclosure is incorporated by reference in the present application.

Figure 1:
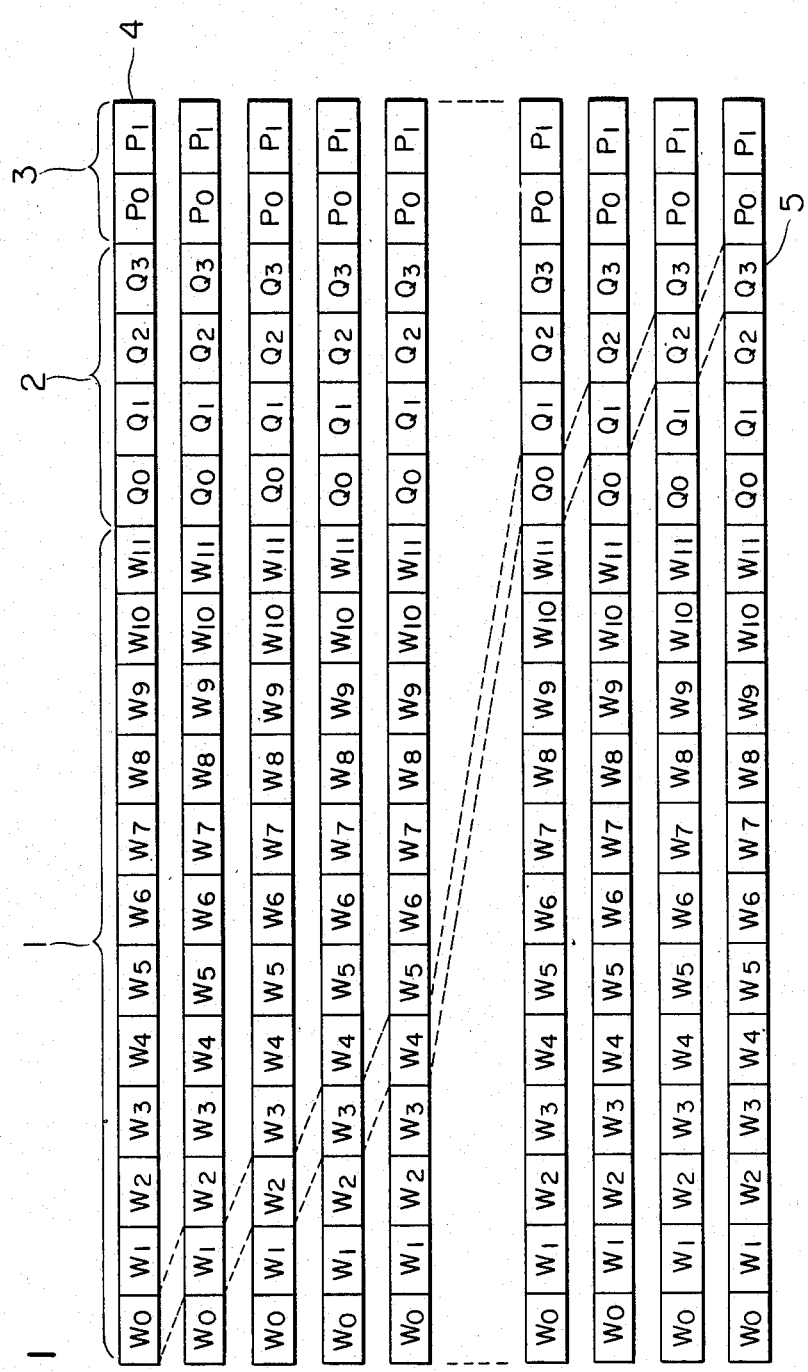
FIG. 1 shows a data arrangement of a doubly-encoded error correction code.

In the related application (European Patent Application No. 84107110.3 filed June 20, 1984), the decoding method of FIG. 1 uses the Reed-Solomon code in which the $C_1$ block has a code length of 18, the number of check words of 2 and a Hamming distance of 3 and the $C_2$ block has a code length of 16, the number of words of 4 and a Hamming distance of 5. Accordingly, in the $C_1$ decoding, one error word can be corrected and in the $C_2$ decoding, S errors whose error locations are unknown and E errors whose error locations are known (hereinafter the former is called errors and the latter is called erasures) can be corrected, where $2S+E \leq 4$. Thus, in the $C_1$ decoding, the error detection and the one-word correction are effected and flags representing the decode conditions are added to the respective words, and in the $C_2$ decoding, one of the following three decodings is effected depending on the status of the flag added to each word so that the error correction of high capability is effected.

(1) S=2 E=0: up to two errors are corrected.
(2) S=1 E=2: one error and two erasures are corrected.
(3) S=0 E=4: Four erasures are corrected.

Figure 2:
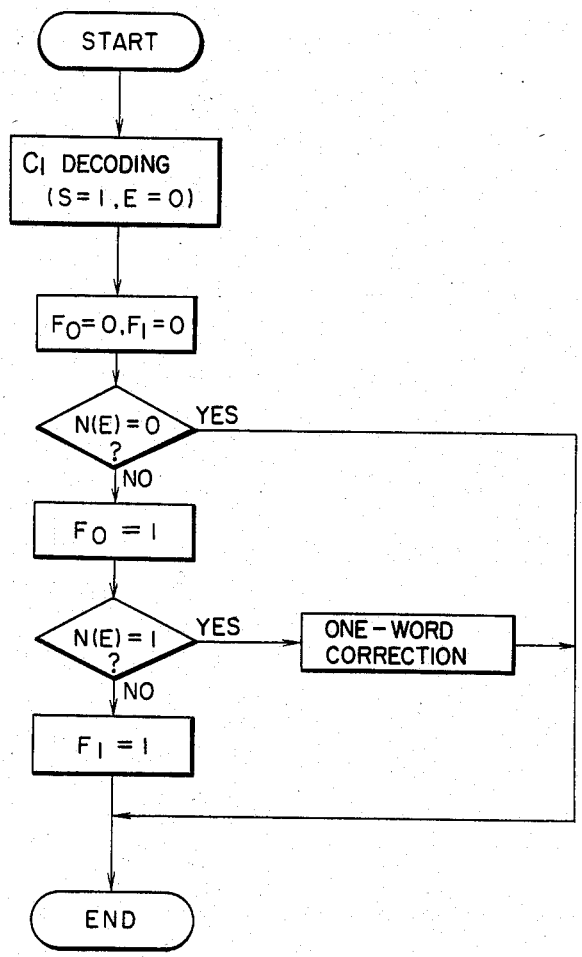
FIG. 2 is a flow chart of a $C_1$ decoding.
Figure 3:
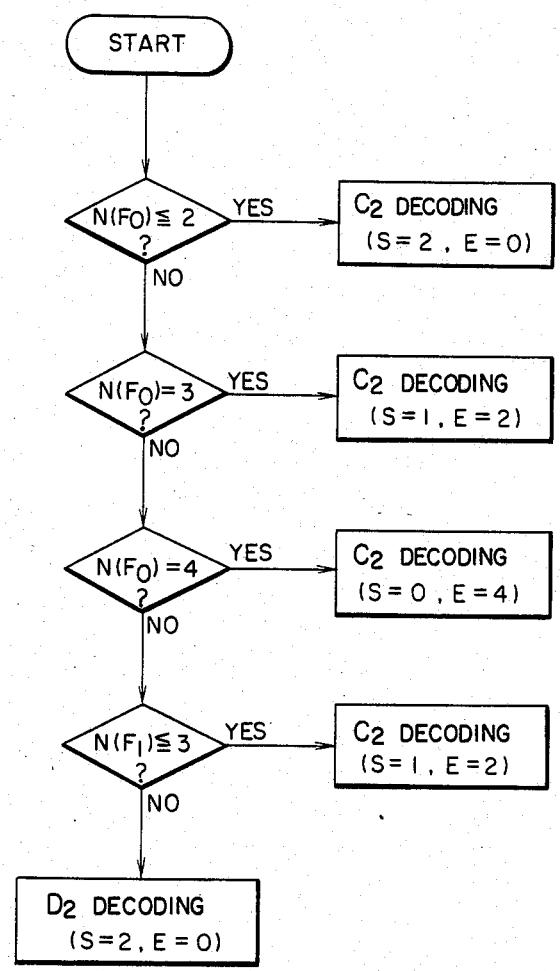
FIG. 3 is a flow chart of one example of the $C_2$ decoding.

FIG. 2 is a flow chart for the $C_1$ decoding. N(E) is the number of errors detected in the $C_1$ decoding when the number of error is one, one-word correction is effected. $F_0$ flag and $F_1$ flag are used as the flags to represent the decode status in the $C_1$ decoding. The $F_0$ flag is set to "1" when the error is detected, and the $F_1$ flag is set to "1" when more than two words are in error and they cannot be corrected. FIG. 3 is a flow chart for the $C_2$ decoding. $N(F_0)$ and $N(F_1)$ are the numbers of the $F_0$ flags and the $F_1$ flags, respectively. In the $C_2$ decoding, the error status is guessed in accordance with the number of flags in the block to determine and select the optimum decoding method.

Figure 4:
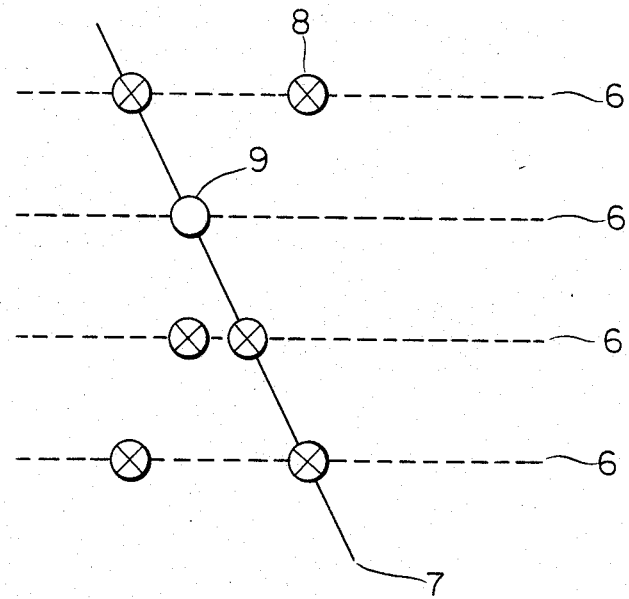
FIGS. 4 and 5 show error patterns for the $C_2$ block having four flags.

For example, when $N(F_0)=4$, that is, when the number of $F_0$ flags (including those having the $F_1$ flags added thereto) is four, the locations to which the flags are added are assumed as error locations (errors with known error locations) and the erasure correction of the formula (3) is effected. FIG. 4 shows an example in which three errors are included in one $C_2$ block. Numeral 6 denotes the $C_2$ block, numeral 7 denotes the $C_2$ block, numeral 8 denotes a flagged error word and numeral 9 denotes a flagged word which is actually correct. It indicates that there is an error in the $C_1$ block to which the word 9 belongs. In the $C_1$ block to which the word 9 belongs. In the $C_1$ decoding, if an error is detected, flags are added to all words (symbols) in the block. If only one word is in error, it is corrected by the $C_1$ decoding. When two or more words are in error, there are correct words and error words. Thus, there are flagged error words and flagged correct words.

In the erasure correction of the formula (3), up to four flagged error words can be corrected. However, since it has no error location detection capability, it may miscorrect if a non-flagged error is included as shown by a word X in a block 7 in FIG. 5, because the word at the location X is not recognized as an error word but the erasure correction is effected therefor. Referring to an example shown in FIG. 5, numeral 10 denotes a non-flagged error. The non-flagged error is due to the failure of detection in the $C_1$ decoding. Accordingly, a problem may arise when the number of check words for $C_1$ is small such as $P_0$ and $P_1$ shown in FIG. 1 and hence a sufficient error detection capability is not provided. In FIG. 1, since the number of check words is two ($P_0$ and $P_1$), the failure of detection may occur if three or more errors are included. In order to prevent the miscorrection due to the failure of detection, the error correction (1) is effected when $N(F_0)=4$. In this case, non-flagged error due to the failure of detection can be detected, and no more than one flagged error can be corrected. However, when the error correction (1) ($S \leq 2$, $E=0$) is effected after the $C_1$ decoding, the errors cannot be corrected if three or more errors are included as shown in FIG. 4. The present invention provides a resolution to improve a limit to such a correction capability.

One embodiment of the present invention is now explained with reference to the error correction code shown in FIG. 1.

As described above, in the decoding of the error correction code of FIG. 1, one-word error can be corrected in the $C_1$ decoding, and two-word error correction, one-word error correction and two-word erasure correction, or four-word erasure correction can be effected in the $C_2$ decoding.

In the $C_1$ decoding, the error detection and the one-word error correction are effected in the same manner as shown in FIG. 2, and if the error is detected, the $F_0$ flags are added, and if the errors are incorrectable, the $F_1$ flags are added to the respective words.

Referring to FIGS. 6 and 9 which show flow charts for the $C_2$ decoding, the procedure of the $C_2$ decoding is explained.

FIG. 9 shows a detail of the error correction method of the present invention shown in FIG. 6. $L(F_0)$ and $L(F_1)$ are number of coincidences of error locations detected by the $C_2$ decoding and the $F_0$-flagged or $F_1$-flagged locations. F is an incorrectable flag to be added to an incorrectable word. When F=1, all words in the $C_2$ block are flagged, and when $F=F_0$, only the $F_0$-flagged words are flagged. For the F-flagged words, error concealment is effected during reproduction by an average interpolation.

(1) First, the decoding is effected with S=2, E=0. Up to two-word errors at any location can be detected. If the number of errors is no more than two, a probability of miscorrection is determined based on the flags added to the error locations and the number of flags in the block, and if the probability is low, the correction is effected. If the probability of miscorrection is high, the errors are incorrectable.

For example, when the number of error detected is one (N(E)=1), it is checked if the $F_1$ flag has been added to the error location detected. If it has been added ($L(F_1)=1$), the decoded result is correct and the error correction is effected. If the $F_1$ flag has not been added ($L(F_1)=0$), the number of $F_1$ flags is checked. If the number of $F_1$ flags is no more than three ($N(F_1) \leq 3$), the decoded result is correct and the error correction is effected. If the number of $F_1$ flags is larger than three ($N(F_1)>3$), the probability of miscorrection is high and the correction is not effected. The thresholds of the numbers of the flags for checking if the decoded result is correct or not are determined by previously calculating probabilities of miscorrections for various values of $L(F_1)$ and $N(F_1)$. A method for calculating the probabilities is disclosed in "Decoding Method for Double-Encoding System" by Hideki Imai and Yasuji Nagasaka, Journal of Association of Electronics and Electrical Communication of Japan, Vol. J 65-A, No. 12, pages 1254–1261, December 1982 and "Decoding Properties of Superstrategy for Crossinterleave Reed-Solomon Codes" by Yashiro et al, the same journal Vol. J 66-A, No. 3, pages 284–285, March 1983.

In the Reed-Solomon code having a Hamming distance of 5, the probability of miscorrection is high when $e+N(E) \geq 5$, where e is the number of actual errors. When $N(E)=1$ and one word error is corrected, the miscorrection occurs if four or more errors are included in the block. When $N(F_1)>3$, a probability that four or more errors are included is higher, and the miscorrection may be effected as shown in FIG. 7. In FIG. 7, numeral 90 denotes a case where a correct symbol or word was determined as an error by the miscorrection.

(2) If three or more errors are detected in (1), and if the member of $F_0$ flag is three, two of the three words to which the $F_0$ flags were added are erased and the decoding with $S=1$ and $E=2$ is effected. If errors are detected only in the flagged words, the correction is made by using the decode result.

(3) If three or more errors are detected in (1) and if the number of $F_0$ flags is four, the four flagged words are erased and the decoding with $S=0$ and $E=4$ is effected and the four-word correction is made.

(4) If three or more errors are detected in (1) and the number of $F_0$ flags is five or more and the number of $F_1$ flags is three, two of the three words to which the $F_1$ flags were added are erased and the decoding with $S=1$ and $E=2$ is effected. If the errors are detected only in the $F_1$-flagged words, the correction is made by using the decode result.

(5) If three or more errors are detected in (1) and the correction conditions (2)–(4) are not met, the errors are incorrectable.

Figure 5:
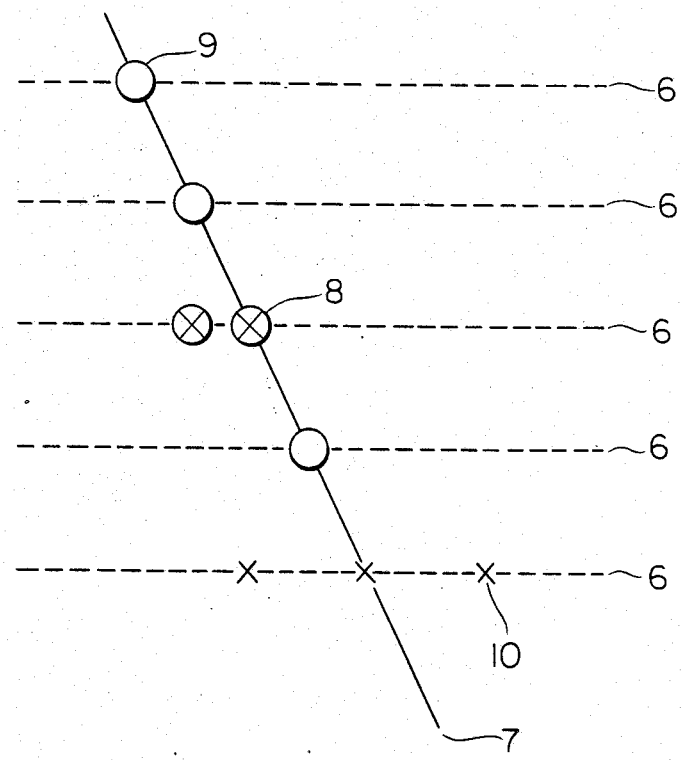

By decoding twice with different decoding method, errors which are incorrectable or miscorrected by one decoding can be corrected. For example, the example of FIG. 4 is correctable by (3) and the example of FIG. 5 is correctable by (1). The errors are incorrectable by (1)–(5) only when $N(F_0)=0$, two or more flagged errors are included and a non-flagged error is included, as shown in FIG. 8. Even in such a case, up to three errors may be corrected by increasing the number of times of decoding and effecting the decoding with $S=1$ and $E=2$ while changing the location of erasure. While the decoding is effected twice in (1)–(5), two different decodings may be simultaneously effected, the optimum decoding method is determined after the decoding and the error correction may be effected by using the decode result by the optimum decoding method.

As shown in FIG. 9, the decode result may be checked by the $F_0$ flags and the $F_1$ flags added in the $C_1$ decoding so that the probability of miscorrection is lowered and the error correction with enhanced error detection and correction capability can be effected.

FIG. 10 shows a flow chart for simultaneously effecting two different $C_2$ decodings. In "Decode 1", the decoding (1) with $S=2$ and $E=0$ is effected, and if the number of errors detected is no more than two, the correction is made by using the decode result, and if the number is more than two, no correction is made. In this case, CS is set to "1". In "Decode 2", the decoding (2) with $S=1$ and $E=2$ or the decoding (3) with $S=0$ and $E=4$ is effected, and if $CS=1$, the correction is made by using the decode result. In the method of FIG. 10, two decoders for simultaneously effecting two different decodings are necessary but the decoding time can be shortened.

FIG. 11 shows an embodiment of an error correction system for correcting errors in accordance with the method of FIG. 10. Numerals 100 and 101 denote error correction circuits shown in detail in FIG. 14. The circuit 100 effects the decoding of "Decode 1" and the circuit 101 effects the decoding of "Decode 2". Numeral 102 denotes an input/output control circuit, numeral 103 denotes a register, numeral 104 denotes an input buffer, numeral 105 denotes an output buffer, numeral 106 denotes an AND circuit and numeral 107 denotes an inverter.

A received signal is simultaneously applied to the error correction circuits 100 and 101. The decodings of "Decode 1" and "Decode 2" are effected parallelly. If the number of errors detected in the "Decode 1" is no more than two, "0" is loaded to the register 103, and if the number of errors is more than two, "1" is loaded to the register 103. When the content of the register 103 is "0", the output buffer of the error correction circuit 100 is selected in the error correction mode and the error is corrected or an incorrectable flag is set depending on the result of the "Decode 1". Similarly, when the content of the register 103 is "1", the error is corrected or the incorrectable flag is set depending on the result of the "Decode 2".

The error correction method of the present invention is also applicable to other doubly-encoded error correction code than that shown in FIG. 1. FIGS. 12 and 13 show another embodiment of the error correction method of the present invention. Numeral 11 denotes an information word, numeral 12 denotes a first check word, and numeral 13 denotes a second check word. In encoding, first check words $Wi_0$–$Wi_7$ are added to 24 information words $Wi_0$–$Wi_{23}$ ($i=0$–29) to form a $C_2$ block 15. Then, second check words $P_{0j}$, $P_{ij}$ ($j=0$–31) are added to 30 information words $W_{0j}$–$W_{29j}$ ($j=0$–23) or 30 first check words $Q_{0k}$–$Q_{29h}$ ($k=0$–7) to form a $C_1$ block 14. In decoding, error detection and correction are effected for the $C_1$ block, and then error detection and correction are effected for the $C_2$ block.

The $C_1$ block uses the Reed-Solomon code having a code length of 32, the number of check words of 2 and a Hamming distance of 3. Accordingly, one-word error correction can be made and the $C_1$ decoding is same as that shown in FIG. 2. The $C_2$ block uses the Reed-Solomon code having a code length of 32, the number of check words of 8 and a Hamming distance of 9. Accordingly, the error correction can be made within a range of $$2S+E \leq 8$$

The procedure of the $C_2$ decoding is explained with reference to the flow chart shown in FIG. 10.

(1) The decoding with $S=4$ and $E=0$ is effected. Thus, up to four error word locations can be detected. If the number of errors detected is no more than three, or if the number of errors is four and a probability of miscorrection is low, three or four error words are corrected.

(2) If the number of errors detected in (1) is more than five and the number of $F_0$ flags is four, the four $F_0$-flagged words are erased and the decoding with $S=2$ and $E=4$ is effected, and if the number of errors detected is no more than two, four to six error words are corrected.

(3) If the number of errors detected in (1) is five or more and the number of $F_0$ flags is five, the five $F_0$-flagged words are erased and the decoding with $S=1$ and $E=5$ is effected, and if the number of errors detected is no more than one, five to six error words are corrected.

(4) If the number of errors detected in (1) is five or more and the number of $F_0$ flags is six, the six $F_0$-flagged words are erased and the decoding with $S=1$ and $E=6$ is effected, and if the number of error detected is no more than one, six to seven error words are corrected.

(5) If the number of errors detected in (1) is five or more and the number of $F_0$ flags is seven, six of the seven $F_0$-flagged words are erased and the decoding with $S=1$ and $E=6$ is effected, and if errors are detected in only the flagged words, six to seven error words are corrected.

(6) If the number of errors detected in (1) is five or more and the number of $F_0$ flags is eight, the eight $F_0$-flagged words are erased and the decoding with $S=0$ and $E=8$ is effected and eight error words are corrected.

(7) When the correction conditions (1)-(6) are not met, the errors are incorrectable ($F=1$, $F=F_0$).

Referring to FIG. 14, an error correction system for correcting errors by the error correction method of the present invention is explained.

FIG. 14 shows a block diagram of the error correction system. Numerals 17-19 denote bus lines, numeral 20 denotes a syndrome generator, numerals 21 and 22 denote ROM's, numeral 24 denotes an arithmetic logic unit, numerals 25, 27 and 29 denote RAM's, numeral 26 denotes a counter, numeral 28 denotes a comparator, numeral 30 denotes a jump condition judge circuit, numeral 31 denotes a program ROM and numeral 32 denotes an address counter.

The present system comprises three bus lines, circuits connected to the bus lines and a control circuit for controlling the operation of the circuits by programs. The bus line 17 is a data bus for exchanging data such as received signals and error patterns, the bus line 18 is a location bus for exchanging data such as data locations, and the bus line 19 is a flag bus for exchanging flag data to be added to the data. A data input/output terminal 38, a location input/output terminal 39 and a flag input/output terminal 40 are connected to the respective buses.

The syndrome generator 20 generates a syndrome by the signal received at the data input/output terminal 38.

The arithmetic logic unit 24 determines an error location and an error pattern by the syndrome generated by the syndrome generator. The arithmetic logic unit 24 carries out multiplication, division and addition operations on a Galois field ($2^8$).

The RAM 25 stores the syndrome and the operation result of the arithmetic logic unit 24. Numeral 23 denotes an eight-input OR circuit which determines whether the data on the data bus 17 is "0" or not.

The ROM's 21 and 22 translate data on the data bus 17 (i and $\alpha^i$) and the location bus 18. The data on the data bus is represented by vector, and the data on the location bus is represented by power. Accordingly, when the data are to be exchanged between the data bus 17 and the location bus 18, the data must be translated from i to $\alpha^i$ of from $\alpha^i$ to i by the ROM 21 or 22.

The counter 26 counts the number of flags in one block. In the second decoding, the number of $F_0$ and $F_1$ is counted by the counter 26, and the count is compared with a predetermined number by the comparator 28 to determine the number of words to be corrected or whether the correction is to be made or not to be made (incorrectable).

The RAM 27 stores the number of flags counted by the counter 26 and the error locations. The comparator 28 compares the number of flags with the predetermined number as described above and also compares data in the course of decoding with a constant.

The RAM 29 stores the flags $F_0$ and $F_1$ which indicate the result of the first decoding and added to the data in the second decoding. The status of the flags stored in the RAM 29 is used to check the presence or absence of the flag at the error location determined by the decoding.

The jump condition judge circuit 30 determines whether a branch of the program is to be carried out or not in accordance with the result determined by the OR circuit 23 and the comparator 28 and the flag status stored in the RAM 29.

The program ROM 31 stores the program which controls the above circuits to effect the decoding. Numeral 33 denotes an instruction signal for determining a RAM address and the constants to be applied to the bus lines and the comparator. Numeral 34 denotes a signal for determining a condition for program branch. The jump condition judge 30 determines whether the branch is to be carried out or not by comparing the signal 34 with the contents of the OR circuit 23, the comparator 28 and the RAM 29. Numeral 35 denotes an instruction signal for determining a branch-to address, and numeral 36 denotes a signal for controlling the buffers and the registers connected to the buses.

The counter 32 controls the program address. The counter 32 advances the address of the program ROM 31 by a clock supplied from a master clock input 41 to cause the program to be executed. When the program is to be branched, the branch-to address 35 is loaded in the counter 32 by the branch instruction 37 to branch the program. A reset signal to the counter 32 is applied to an input terminal 42 at a time of start of the program.

In correcting the errors, the input signal is received, the syndrome is generated, and in the $C_2$ decoding, the number of flags is counted and the flag status is stored in the RAM 29. Then, the decoding is effected by the program, the error locations and the error patterns are determined by the arithmetic logic unit and the error data are corrected. If the errors are incorrectable in the $C_1$ decoding and the $C_2$ decoding, flags to be added to the data are outputted from the flag input/output 40.

As described above, in accordance with the error correction system of the present embodiment, the circuits are controlled by the program and are similarly applicable to the embodiment of FIGS. 15 and 16. Accordingly, a circuit scale may be small and the decoding of different error correction code can be attained by merely changing the program.

FIGS. 15 and 16 show an embodiment of the present invention applied to a cross-interleave Reed-Solomon code (British Patent Specification No. GB 2076569A) used in a digital audio disc. This code uses a Reed-Solomon code for the $C_1$ block, which has a code length of 32, the number of check words of 4 and a Hamming distance of 5, and a Reed-Solomon code for the $C_2$ block, which has a code length of 28, the number of check words of 4 and a Hamming distance of 5.

A cross-interleave Reed-Solomon code decode circuit comprises a reproduction signal input terminal, a $C_1$ decoder, a deinterleave circuit, a $C_2$ decoder and an output signal terminal. In decoding, 32-word reproduction signal is $C_1$-decoded. 24-word information and $C_2$ check words after the $C_1$ decoding are deinterleaved and then $C_2$-decoded to produce 24-word information as a decode result.

FIG. 15 shows a flow chart for the $C_1$ decoding. As described above, the $C_1$ code uses the Reed-Solomon code having the minimum distance of 5. Accordingly, one-word or two-word error correction can be made. In the $C_1$ decoding, no error, one-word correction, two-word correction or incorrectable error because of three or more error words are possible. Three flags $F_0$, $F_1$, $F_2$ shown in Table 1 are added to the words in the $C_1$ block as flags for indicating those four types. In actual, the $C_1$ flag information can be handled as two-bit information per block.

TABLE 1

| Decoding | $C_1$ flags | | | |
|---|---|---|---|---|
| | $F_0$ | $F_1$ | $F_2$ | |
| No error | 0 | 0 | 0 | 00 |
| One-word correction | 1 | 0 | 0 | 01 |
| Two-word correction | 1 | 1 | 0 | 10 |
| Incorrectable | 1 | 1 | 1 | 11 |

FIG. 16 shows a flow chart for $C_2$ decoding. In the $C_2$ decoding, the words to which the flags were added in the $C_1$ decoding are erased and the erasure correction is effected. Accordingly, the error correction is made within the range of $2S+4E\leq4$ as is done in the embodiment of FIG. 9.

Decoding (1): Two-word error correction
Decoding (2): Two-word erasure+one-word error correction
Decoding (3): Four-word erasure correction In order to enhance the error correction capability, it is necessary to correct many errors by the decoding (2) and the decoding (3). However, the erasure correction has a low detection capability and the correction capability is deteriorated depending on the erasure selected. In order to enhance the error correction capability and the detection capability, a decoding algorithm may be used so that the decoding (2) or the decoding (3) is effected only when the probability of miscorrection is low.

A specific algorithm for the $C_2$ decoding is explained with reference to FIG. 16.

(1) The decoding with $S=2$ and $E=0$ is first effected. Thus, up to two-word errors at any locations can be detected. When the number of errors detected is no more than two, the correction is made if the probability of miscorrection is low based on judging from the presence or absence of the flags added to the error locations and the number of flags in the block. If the probability of miscorrection is high, the errors are incorrectable.

(2) If the number of errors detected in (1) is three or more and if the number of $F_1$ flags is three, two or three $F_0$-flagged words are erased and the decoding with $S=1$ and $E=2$ is effected. If the errors are detected only in the flagged words, the correction is made by using the decode result.

(3) If the number of errors detected in (1) is three or more and the number of $F_1$ flags is three or more and the number of $F_2$ flags is two or three, the two $F_2$-flagged words are erased and the decoding with $S=1$ and $E=2$ is effected. If the errors are detected only in the $F_1$-flagged words, the correction is made by using the decode result.

(4) If the number of errors detected in (1) is three or more and the correction condition (2) or (3) is not met, the errors are incorrectable.

FIG. 17 shows a comparison of the error correction capabilities and the error detection capabilities in the embodiment of the present invention shown in FIGS. 15 and 16 and the prior art system. In FIG. 17, an abscissa represents a word error rate and an ordinate represents an error probability after error correction. A curve I represents the correction capability and the detection capability in the prior art system disclosed in the U.S. Pat. No. 4,437,185 to Sako et al. In this correction method, only one flag (pointer code signal) is added to each word signal in the first $C_1$ decoding, and two errors can be corrected in the next $C_2$ decoding. A curve II represents the correction capability and the detection capability by the correction method disclosed in the above related application. In this method, the $C_2$ decoding uses the correction procedures by three decodings, that is, error correction, error and erasure correction, and erasure correction. A curve III represents the correction capability and the detection capability by the embodiment of the present invention. The correction procedure of the above related application is further improved to enhance the correction capability. In the characteristics of FIG. 17, the detection capabilities are substantially equal for the respective cases I–III. On the other hand, the correction capability of the characteristic II at word error rate of $10^{-3}$ is two orders higher than that of the characteristic I, and that of the characteristic III is four orders higher than that of the characteristic I.

We claim:

1. An error correction method in decoding code words having first code blocks, including a plurality of information words arranged in a first arrangement and a plurality of first check words generated by a code having a Hamming distance of $d_1$ to said information words, and second code blocks including a plurality of information words arranged in a second arrangement and a plurality of first check words each having a plurality of information words and a plurality of first check words belonging to a different one of said first blocks, and a plurality of second check words generated by a code having a Hamming distance of $d_2$ to said plurality of information words and said plurality of first check words, comprising the steps of:

(a) in a first decoding stage, at least detecting errors for said second code blocks and adding at least one type of flags representing a decoding status; and (b) in a second decoding stage, detecting errors for said first code blocks and correcting $S_2$ word errors and E word erasures satisfying $2S_2+E\leq d_1l-1$, where $S_2$ is the number of word errors at unknown locations and E is the number of erasures and determining error locations and error patterns, for a plurality of combinations of $S_2$ and E, determining the combination of $S_2$ and E having a high correction capability and a low probability of miscorrection based on the plurality of determined error locations and error patterns, and correcting the word error in the second decoding stage based on the error location and the error pattern of the selected combination of $S_2$ and E;

wherein said step of at least detecting errors includes error detection and error correction for $S_1$ words, where $2S_1 \leq d_2 - 1$.

2. An error correction method according to claim 1 wherein said code words are doubly-encoded Reed-Solomon codes.

3. An error correction method according to claim 1 wherein said code words are doubly-encoded cyclic redundancy check codes.

4. An error correction method according to claim 1 wherein the decode result of the combination of $S_2$ and E having a minimum probability of miscorrection determined by the decoding result and the number of flags in a unit block is selected out of the plurality of decode results for the error locations and error patterns, and the word error is corrected based on the selected decode result.

5. An error correction method according to claim 1, wherein, in said second decoding stage, error locations and error patterns are parallelly or sequentially determined for the plurality of combinations of $S_2$ and E satisfying $2S_2 + E \leq d_1 - 1$.

6. An error correction method in decoding code words having first code blocks, including a plurality of information words arranged in a first arrangement and a plurality of first check words generated by a code having a Hamming distance of $d_1$ to said information words, and second code blocks including a plurality of information words arranged in a second arrangement and a plurality of first check words each having a plurality of information words and a plurality of first check words belonging to a different one of said first blocks, and a plurality of second check words generated by a code having a Hamming distance of $d_2$ to said plurality of information words and said plurality of first check words, comprising the steps of:

(a) in a first decoding stage, at least detecting errors for said second code blocks and adding at least one type of flags representing a decoding status; and (b) in a second decoding stage, detecting errors for said first code blocks and correcting $S_2$ word errors and E word erasures satisfying $2S_2 + E \leq d_1 1 - 1$, where $S_2$ is the number of word errors at unknown locations and E is the number of erasures and determining error locations and error patterns, for a plurality of combinations of $S_2$ and E, determining the combination of $S_2$ and E having a high correction capability and a low probability of miscorrection based on the plurality of determined error locations and error patterns, and correcting the word error in the second decoding stage based on the error location and the error pattern of the selected combination of $S_2$ and E;

wherein, in said second decoding stage, error locations and error patterns are parallelly or sequentially determined for the plurality of combinations of $S_2$ and E satisfying $2S_2 + E \leq d_1 - 1$.

7. An error correction method according to claim 6, wherein said step of at least detecting errors including error detection and error correction for $S_1$ words, where $2S_1 \leq d_2 - 1$.

8. An error correction method according to claim 6, wherein said code words are double-encoded Reed-Solomon codes.

9. An error correction method according to claim 6, wherein said code words are double-encoded cyclic redundancy check codes.

10. An error correction method according to claim 6, wherein the decode result of the combination of $S_2$ and E having a minimum probability of miscorrection determined by the decoding result and the number of flags in a unit block is selected out of the plurality of decode results for the error locations and error patterns, and the word error is corrected based on the selected decode result.

11. An error correction system for decoding an error correcting code or an error correcting code with flags indicating an error of a code word, said error correcting code being produced over a Galois field in which the code length in n words and the number of information words is (n−k) and the number of check words is k, comprising:

(a) syndrome generator means for generating k syndromes in response to an input signal includng information words and check words of one code block;

(b) arithmetic logic means for performing multiplication, division and addition over the Galois field produced by said syndrome generator means so as to provide an arithmetic result;

(c) counter means for counting a plurality of types of flags for information words and check words of each code block;

(d) data memory means for storing the values of said syndromes from said syndrome generator means, the arithmetic result of the arithmetic operation by said arithmetic logic means, the numbers of flags counted by said counter means, and the locations of flags added to said input signal;

(e) comparator means for comparing the number of flags counted by said counter means and the numbers of errors indicated by the arithmetic result of the arithmetic operation by said arithmetic logic means, with predetermined numbers to determine the type of error correction to be performed;

(f) program memory means for storing a program for controlling said arithmetic logic means, said comparator means and said data memory means so as to perform an error correcting operation and effect the addition of flags;

(g) judging circuit means for determining in accordance with a program supplied from said program memory means, whether or not to jump the program based on the compare results from said comparator means, the numbers of flags counted by said counter means and the arithmetic result produced by the arithmetic logic means; and (h) control circuit means responsive to said judging circuit means for controlling the addressing of said program memory means;

(i) said arithmetic logic means being coupled to said syndrome generator means, said data memory means and said program memory means for determining error locations and error patterns based on the syndromes representing the numbers of errors and the flag locations received therefrom.

* * * * *